US006362970B1

(12) United States Patent
Hinzpeter et al.

(10) Patent No.: US 6,362,970 B1
(45) Date of Patent: Mar. 26, 2002

(54) DISTRIBUTION DEVICE FOR A ROTARY PRESS AND PROCESS OF MANUFACTURE

(75) Inventors: Jürgen Hinzpeter; Ingo Schmidt, both of Schwarzenbek; Joachim Greve, Pogeez; Jörg Reitberger; Ulrich Gathmann, both of Hamburg; Klaus Peter Preuss, Mölln, all of (DE)

(73) Assignee: Wilheim Fette GmbH, Schwarzenbek (DE)

( * ) Notice: Subject to any disclaimer, the term of this patent is extended or adjusted under 35 U.S.C. 154(b) by 0 days.

(21) Appl. No.: 09/550,994

(22) Filed: Apr. 18, 2000

(30) Foreign Application Priority Data

Apr. 28, 1999 (DE) ........................................ 199 19 333

(51) Int. Cl.$^{7}$ ............................ H05K 7/00; H02B 1/04

(52) U.S. Cl. ...................... 361/752; 439/76.1; 439/76.2

(58) Field of Search .............................. 439/76.1, 76.2, 439/638; 361/752, 753, 801

(56) References Cited

U.S. PATENT DOCUMENTS 4,703,397 A * 10/1987 Minoura et al. ............ 361/826
5,581,130 A 12/1996 Boucheron ................ 307/10.1

FOREIGN PATENT DOCUMENTS

| | | | |
|---|---|---|---|
| DE | 91 00 962.6 | U1 | 5/1991 |
| DE | 44 37 316 | A1 | 4/1996 |
| DE | 196 44 123 | A1 | 5/1998 |
| DE | 197 16 137 | C1 | 10/1998 |

* cited by examiner

*Primary Examiner*—Jayprakash N. Gandhi
(74) *Attorney, Agent, or Firm*—Faegre & Benson LLP

(57) ABSTRACT

A distribution device for a rotary press, including:

a distribution box in or on the housing of the rotary press, a plurality of connectors on opposed sides of the distribution box for connection to one cable each at the externally located end, a p.c. board in the distribution box for an electric connection between opposed connectors with the connectors having soldering pins which are extended through an opening in the distribution box and are fixed by soldering in appropriate bores of the p.c. board at their free ends.

6 Claims, 1 Drawing Sheet

DISTRIBUTION DEVICE FOR A ROTARY PRESS AND PROCESS OF MANUFACTURE

BACKGROUND OF THE INVENTION

This invention relates to a distribution device for a rotary press.

The drive and the control of rotary presses for the manufacture of tablets or similar products require that electric connections for power supply and signal transfer be led into and out of the housing of the press. To this end, it is known to provide a so called distribution box, which usually is equipped with connectors. The connectors may be joined to connecting plugs on cables.

Distribution boxes of a conventional design have so-called series terminal boxes in the interior of the housing and connectors installed on the walls of the box. The connectors are electrically connected to the distribution terminal boxes by means of individual electric cores in a manual way. The drawback of such distribution boxes is that they require great installation expenditure and also need a lot of space.

It is the object of the invention to provide a distribution device for a rotary press the installation expenditure of which is significantly diminished and which also needs less space.

SUMMARY OF INVENTION

In the inventive distribution device, a single p.c. board is arranged in the box of the distribution device. The single p.c. board has prefabricated on it all connections which require to be made inside the box upon completion of installation. The p.c. board may be manufactured in a known manner. In addition, it contains a number of bores. Soldering pins are inserted and fixed by soldering in the bores on opposed sides, which pins are connected to the connectors and are passed through an opening in the housing.

To manufacture the p.c. board, the common industrial processes for the manufacture of a printed circuit are employed. The manufacture of the connectors having the soldering pins is separate. Subsequently, the components are assembled wherein all connector assemblies can be mounted simultaneously according to the inventive process and may be fixed by soldering in a solder bath subsequently.

In the invention a multi-pole connector is fixed by soldering to the p.c. board on one side thereof, and an outer connector having an appropriate number of connecting pins is mounted at the outside of the box where the connecting pins are passed into the distribution box through an opening thereof and are inserted in contact openings or bores of the inner connector. The outer connector has been designed for a connecting plug having complementary contact elements to be brought together with the connector by a simple plug-in action. The way of connection according to claim 2 is advantageous where a multiplicity of individual lines arriving from outside need to be passed into the interior of the distribution box via a joint multi-core cable and a joint connecting plug and an appropriate connector assembly.

In an aspect of the invention, the outer connectors are provided to be mounted on connecting plates which are installed at the border of a continuous frame, preferably by means of continuous sealings.

Because the outer connectors have to be bolted to an appropriate terminating plate for mechanical reasons, one aspect of the invention provides that the connectors have mounted on them a connecting plate which is bolted against the inside of the respective terminating plate.

The invention will now be explained in detail with reference to an embodiment illustrated in the drawings.

DETAILED DESCRIPTION OF THE PREFERRED EMBODIMENTS

Figure 2:
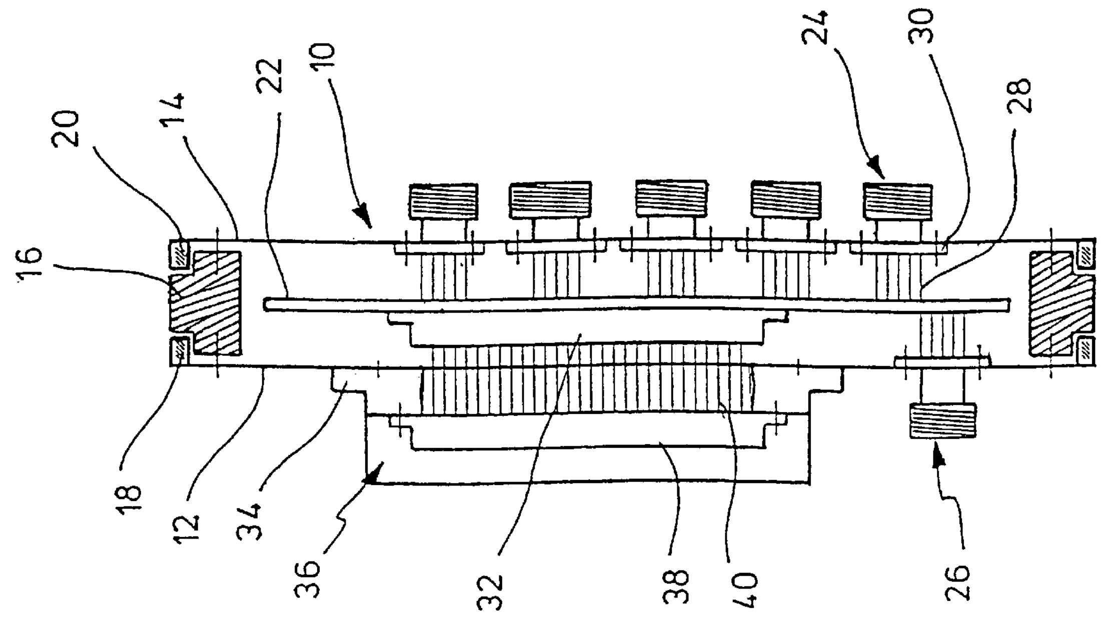
FIG. 2 shows a section through the distribution device of FIG. 1.

A tabulating machine is outlined at 1, which may be a conventional tabulating machine. A distribution box 10 is mounted in a recess 2 of the housing 1, e.g. on a wall outlined at 3. Three plugs 4, 5, and 6 which are connected to multi-core cables, extend from the distribution box 10 towards the left-hand side. The cables lead to individual parts of the tabulating machine and serve for power supply or transfer of signals or the like.

A multi-core cable 7 is shown to lead to a connecting plug housing 8 from the outside of the machine housing 1. The plugs 4 to 6 and also the plug 8 of the housing are connected to the distribution box 10. This is shown more distinctly in FIG. 2 with the arrangement shown in FIG. 2 turned by 180 ° as compared to that of FIG. 1. The connection for a multi-core cable such as cable 7 is shown on the left hand side in FIG. 2.

Referring to FIG. 2, the box 10 can be seen which comprises two parallel disposed sheet metal plates 12, 14 which are mounted on a continuous frame 16 via a bolted joint. Sealings 18 and 20 are located between the frame 16 and the plates 12, 14. This creates a sealed space inside the box 10.

A p.c. board 22 is disposed inside the box 10. In the illustration shown, the p.c. board is retained in a freely pendant position in the interior and in a way yet to be described. It is also possible, however, to mechanically mount the printed-circuit board in an appropriate way, e.g. on the frame 16.

Figure 1:
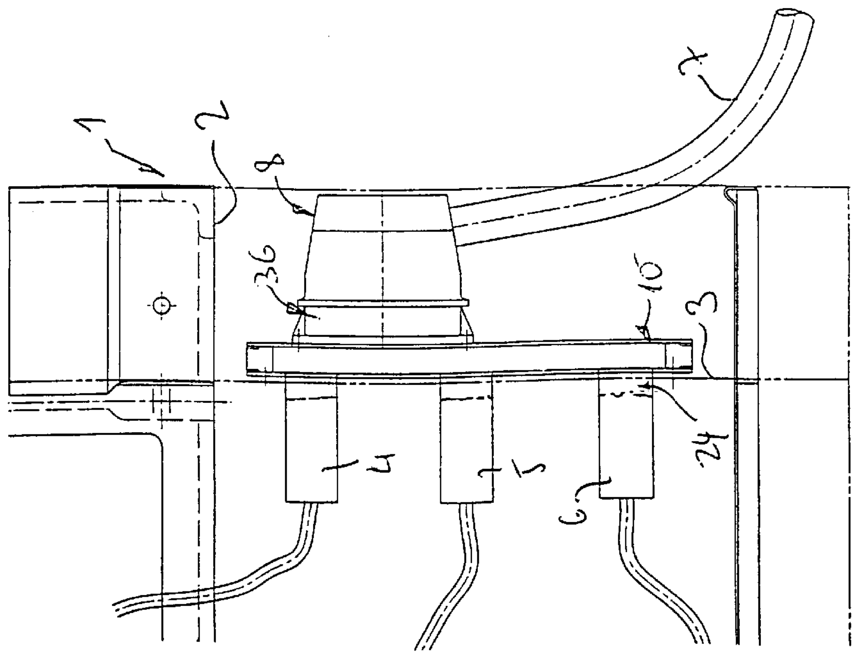
FIG. 1 schematically shows a distribution device according to the invention.

The p.c. board 22 accommodates all electric connections as are desirable in the distribution box 10 when it is disposed, for example, in or on the housing of a rotary press for the manufacture of tablets as is shown in FIG. 1, for example. The p.c. board 22 is manufactured in a known manner with no need to make detailed reference thereto.

Further referring to FIG. 2, individual connectors 24 can be seen which are mounted on the plate 14, and also a connector 26 which is mounted on the opposite plate 12, viz. in a manner which will be described further below. The connectors 24, 26 are of an identical structure. Each connector 24, 26 has soldered pins 28 which are connected to the contact elements in the connectors 24, 26. The contact elements may be connecting plug pins or pin sockets and may be brought into an electric contact with complementary contact elements of a connector an a cable.

During manufacture, the connectors 24, 26 are made along with the soldered pins 28. All connectors may be connected to opposed sides of the p.c. board 22 via an appropriate component-inserting device in a joint assembling operation. The p.c. board 22 has appropriate bores which are engaged by the soldering pins 28. The soldering pins 28 may be fixed by soldering in a solder bath subsequently. Upon completion, the plates 12, 14 are mounted subsequently. They have holes or apertures such that the outer part of the connectors 24 may pass through the holes.

What needs to be added here is that the connectors 24, 26 have also connected to them connecting plates 30 which already have taken their positions after the connectors 24, 26 are fixed by soldering. The terminating plates 12, 14 are then pushed over the externally located parts of the connectors 24, 26 and brought into the connecting plates 30 an abutting relationship and are bolted thereto. This will firmly connect the connectors 24, 26 to the plates 12, 14 and, hence, to the distribution box housing 10. Also, the p.c. board is retained inside the box 10 in the same way.

Connected to the left-hand side of the p.c. board 22 is an inner connector 32. Its contact pins (not shown) engage respective bores of the p.c. board 22 and are fixed by soldering therein. In addition, the inner connector 32 has a series of contact openings or bores on the side facing away from the p.c. board 22.

Bolted onto the outside of the plate 12 is a frame 34 to which a connector housing 36 is connected by bolting. The connector housing 36 has mounted in it by bolting an outer connector 38 which contains a multiplicity of contact pins 40 which are inserted in the mentioned contact openings of the inner connector 32. The connector housing 36 and the outer connector 38, in turn, have contact elements in the form of pins or bushings which are adapted to engage complementary contact elements of the cable connecting plug 8 (FIG. 1). The plate 12 has an opening or aperture which is sufficiently sized to enable the contact pins 40 to be passed through. During manufacture, the inner connector 32 is mounted first. The connector housing 36 may already have been connected to the plate 12 so that when the plate 12 is connected to the frame 16 the contact pins 40 will engage the respective contact openings of the inner connector 32.

What is claimed is:

1. A distribution device for a rotary press, comprising:

a distribution box (10) in or on the housing (1) of the rotary press, a single p.c. board (22) in the distribution box (10)

a plurality of connectors (24) on one side of the distribution box (10) which include soldering pins (28) which extend through an opening in the distribution box (10) and are adapted to be soldered to one side of the p.c. board (22) with their free ends in corresponding bores of the p.c. board, an inner connector (32) inside the distribution box (10) which is soldered to the opposite side of the p.c. board (22), and further an outer connector (38) mounted on the opposite side of the distribution box (10) which includes a corresponding number of connector pins (40) which are adapted to be plugged into contact openings of the inner connector (32) through an opening in the distribution box (10).

2. The distribution device according to claim 1, characterized in that the outer connector (38) is mounted on a terminating plate (12) of the distribution box (10), which is mounted on a continuous frame (16) via a sealing (18) at the edge.

3. The distribution device according to claim 1, characterized in that the connectors (24) have mounted on them respective connecting plates (30) which are bolted against the inside of a respective terminating plate (14).

4. The distribution device according to claim 2, characterized in that the outer connector (38) is mounted on a frame (34) attached to the outside of the distribution box (10).

5. The distribution device according to claim 1, characterized in that the p.c. board (22) is retained in the distribution box (10) by means of the soldering pins (28) and the connector pins (40).

6. A process for the manufacture of a distributor device for rotary presses, characterized by the steps of:

plugging together a p.c. board (22), an inner connector (32) and a plurality of connectors (24, 26) on opposed sides of the p.c. board (22) in a single operation and which are soldered to each other in a solder bath subsequently, then, pushing terminating plates (12, 14) of a distribution box (10), which are fitted with respective openings, over the connectors (24, 26, 32) and mounting them in a frame (16) of the distribution box (10), bolting connecting plates (30) of the connectors (24, 26) to the terminating plates (12, 14) at the inside thereof, and providing an outer conductor (38) mounted on the opposite side of the distribution box (10) which includes a corresponding number of connector pins (40) which are adapted to be plugged into contact openings of the inner connector (32) through an opening in the distribution box (10).

* * * * *